(12) United States Patent
Hirler et al.

(10) Patent No.: US 8,823,087 B2
(45) Date of Patent: Sep. 2, 2014

(54) SEMICONDUCTOR DEVICE INCLUDING AUXILIARY STRUCTURE AND METHODS FOR MANUFACTURING A SEMICONDUCTOR DEVICE

(75) Inventors: Franz Hirler, Isen (DE); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 233 days.

(21) Appl. No.: 13/420,768

(22) Filed: Mar. 15, 2012

(65) Prior Publication Data

US 2013/0240985 A1 Sep. 19, 2013

(51) Int. Cl.
*H01L 29/78* (2006.01)
*H01L 21/336* (2006.01)

(52) U.S. Cl.
USPC .............. 257/330; 257/E29.262; 257/E21.41; 438/270

(58) Field of Classification Search
CPC .................................................. H01L 29/7813
USPC ........... 257/E29.262, 330–334; 438/270–272
See application file for complete search history.

(56) References Cited

U.S. PATENT DOCUMENTS

| | | | |
|---|---|---|---|
| 5,164,325 A | 11/1992 | Cogan et al. | |
| 5,298,781 A | 3/1994 | Cogan et al. | |
| 2010/0013552 A1* | 1/2010 | Darwish et al. | 327/581 |
| 2011/0133272 A1 | 6/2011 | Mauder et al. | |
| 2011/0147843 A1 | 6/2011 | Wood et al. | |

FOREIGN PATENT DOCUMENTS

| | | |
|---|---|---|
| DE | 10210138 B4 | 7/2005 |
| DE | 102006062011 B4 | 12/2008 |
| DE | 102009060072 A1 | 6/2011 |

* cited by examiner

*Primary Examiner* — Daniel Shook
(74) *Attorney, Agent, or Firm* — Murphy, Bilak & Homiller, PLLC

(57) ABSTRACT

A semiconductor device includes a trench region extending into a drift zone of a semiconductor body from a surface. The semiconductor device further includes a dielectric structure including a first step and a second step along a lateral side of the trench region. The semiconductor device further includes an auxiliary structure of a first conductivity type between the first step and the second step, a gate electrode in the trench region and a body region of a second conductivity type other than the first conductivity type of the drift zone. The auxiliary structure adjoins each one of the drift zone, the body region and the dielectric structure.

25 Claims, 12 Drawing Sheets

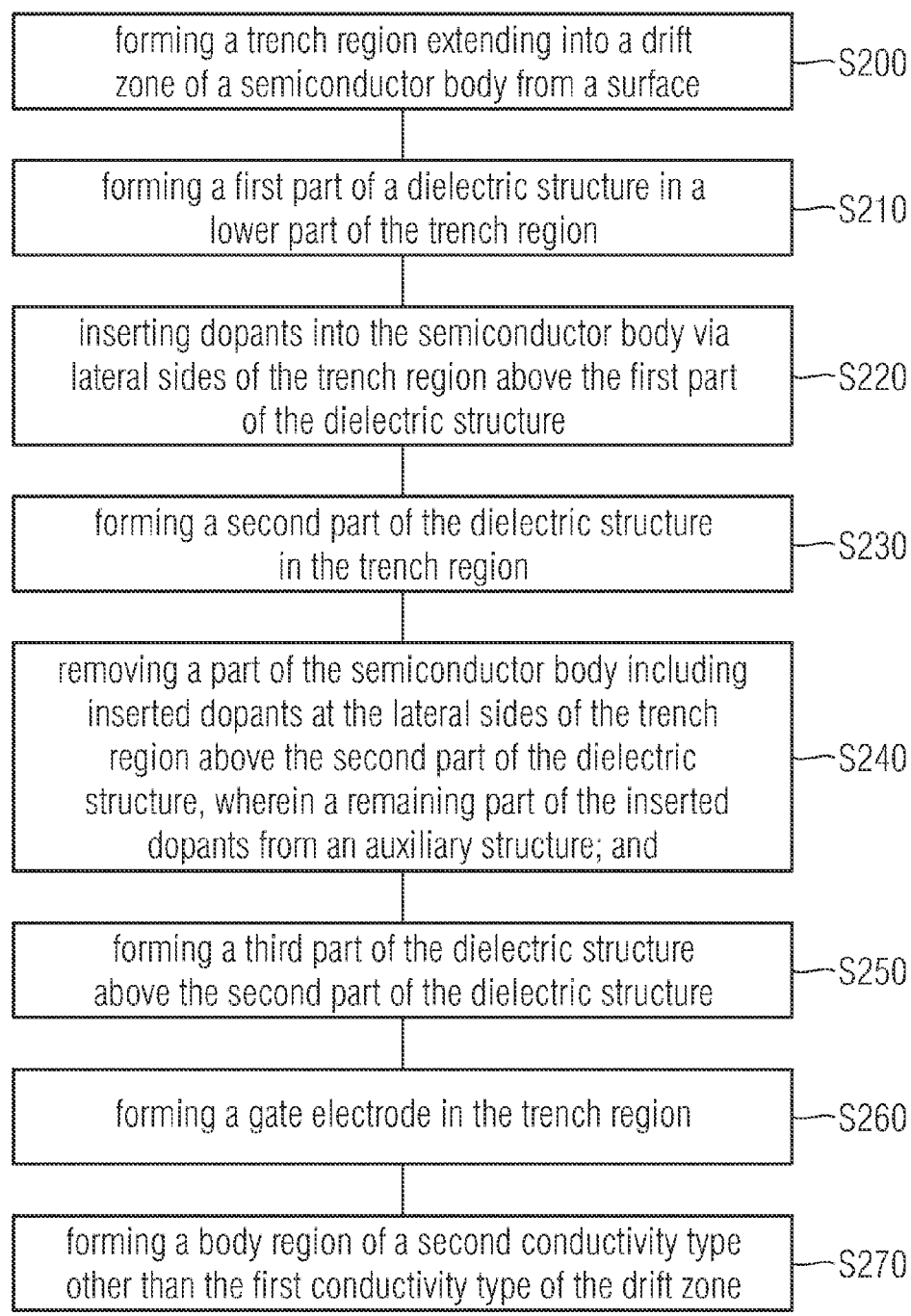

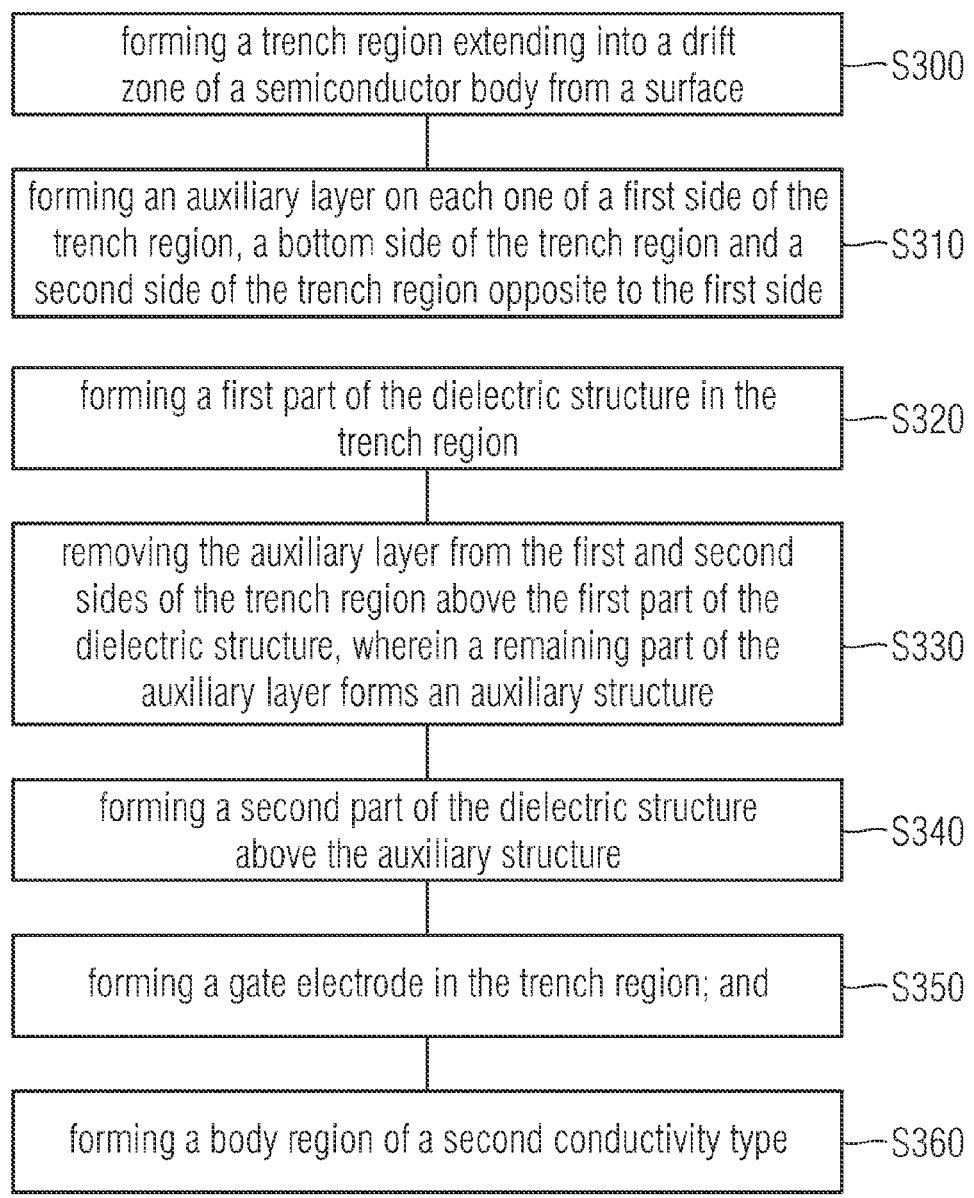

SEMICONDUCTOR DEVICE INCLUDING AUXILIARY STRUCTURE AND METHODS FOR MANUFACTURING A SEMICONDUCTOR DEVICE

BACKGROUND

The development of new generations of semiconductor components, in particular of vertical power semiconductor components, is driven by the goal of increasing a switching speed of switching elements, e.g. Field Effects Transistors (FETs), and reducing the so-called specific on-resistance Ron (resistance per unit area). Reducing Ron allows to minimize the static power loss and to provide power semiconductor components having a higher current density. It is thereby possible to use smaller and hence more cost-effective semiconductor components for the same total current.

It is desirable to provide an improved trade-off between the specific on-resistance Ron of semiconductor components and their switching speed and to provide methods for manufacturing these semiconductor components.

SUMMARY

According to an embodiment of a semiconductor device, the semiconductor includes a trench region extending into a drift zone of a semiconductor body from a surface. The semiconductor device further includes a dielectric structure including a first step and a second step along a lateral side of the trench region. The semiconductor device further includes an auxiliary structure of a first conductivity type between the first step and the second step. The semiconductor device further includes a gate electrode in the trench region and a body region of a second conductivity type other than the first conductivity type of the drift zone. The auxiliary structure adjoins each one of the drift zone, the body region and the dielectric structure.

According to another embodiment of a semiconductor device, the semiconductor includes a trench region extending into a drift zone of a semiconductor body from a surface. The semiconductor device further includes a dielectric structure including a laterally staggered arrangement of an upper side face and a lower side face with a step between the upper side face and the lower side face. The semiconductor device further includes an auxiliary structure of a first conductivity type adjoining only the lower side face and the step with respect to the dielectric structure. The semiconductor device further includes a gate electrode in the trench region and a body region of a second conductivity type other than the first conductivity type of the drift zone. The auxiliary structure further adjoins each one of the drift zone and the body region.

According to yet another embodiment of a semiconductor device, the semiconductor device includes a trench region extending into a drift zone of a semiconductor body from a surface. The semiconductor device further includes an auxiliary structure of a first conductivity type adjoining each one of a first side of the trench region, a bottom side of the trench region and a second side of the trench region opposite the first side. The semiconductor device further includes a dielectric structure in the trench region. The semiconductor device further includes a gate electrode in the trench region and a body region of a conductivity type other than the conductivity type of the drift zone. The auxiliary structure adjoins each one of the drift zone, the body region and the dielectric structure. A first distance from the surface to a location where an interface between the drift zone and the body region adjoins the auxiliary structure is larger than a second distance from the surface to a bottom side of the gate electrode.

According to an embodiment of a method for manufacturing semiconductor device, the method includes forming a trench region extending into a drift zone of a semiconductor body from a surface. The method further includes forming a first part of a dielectric structure in a lower part of the trench region and forming an auxiliary layer on lateral sides in an upper part of the trench region. The method further includes forming a second part of the dielectric structure in the trench region and removing at least part of the auxiliary layer from the lateral sides of the trench region above the second part of the dielectric structure, wherein a remaining part of the auxiliary layer forms an auxiliary structure. The method further includes forming a third part of the dielectric structure above the auxiliary structure, forming a gate electrode in the trench region and forming a body region of a second conductivity type other than the first conductivity type of the drift zone.

According to another embodiment of a method for manufacturing a semiconductor device, the method includes forming a trench region extending into a drift zone of a semiconductor body from a surface. The method further includes forming a first part of a dielectric structure in a lower part of the trench region and inserting dopants into the semiconductor body via lateral sides of the trench region above the first part of the dielectric structure. The method further includes forming a second part of the dielectric structure in the trench region and removing a part of the semiconductor body including inserted dopants at the lateral sides of the trench region above the second part of the dielectric structure, wherein a remaining part of the inserted dopants form an auxiliary structure. The method further includes forming a third part of the dielectric structure above the second part of the dielectric structure, forming a gate electrode in the trench region and forming a body region of a conductivity type other than the conductivity type of the drift zone.

According to yet another embodiment of a method for manufacturing semiconductor device, the method includes forming a trench region extending into a drift zone of a semiconductor body from a surface. The method further includes forming an auxiliary layer on each one of a first side of the trench region, a bottom side of the trench region and a second side of the trench region opposite to the first side. The method further includes forming a first part of the dielectric structure in the trench region and removing the auxiliary layer from the first and second sides of the trench region above the first part of the dielectric structure, wherein a remaining part of the auxiliary layer forms an auxiliary structure. The method further includes forming a second part of the dielectric structure above the auxiliary structure, forming a gate electrode in the trench region and forming a body region.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

FIG. 6 illustrates a schematic process chart of one embodiment of a method for manufacturing a semiconductor device as illustrated in FIG. 2.

FIG. 8 illustrates a schematic process chart of one embodiment of a method for manufacturing a semiconductor device as illustrated in FIG. 3.

DETAILED DESCRIPTION

Figure 1:
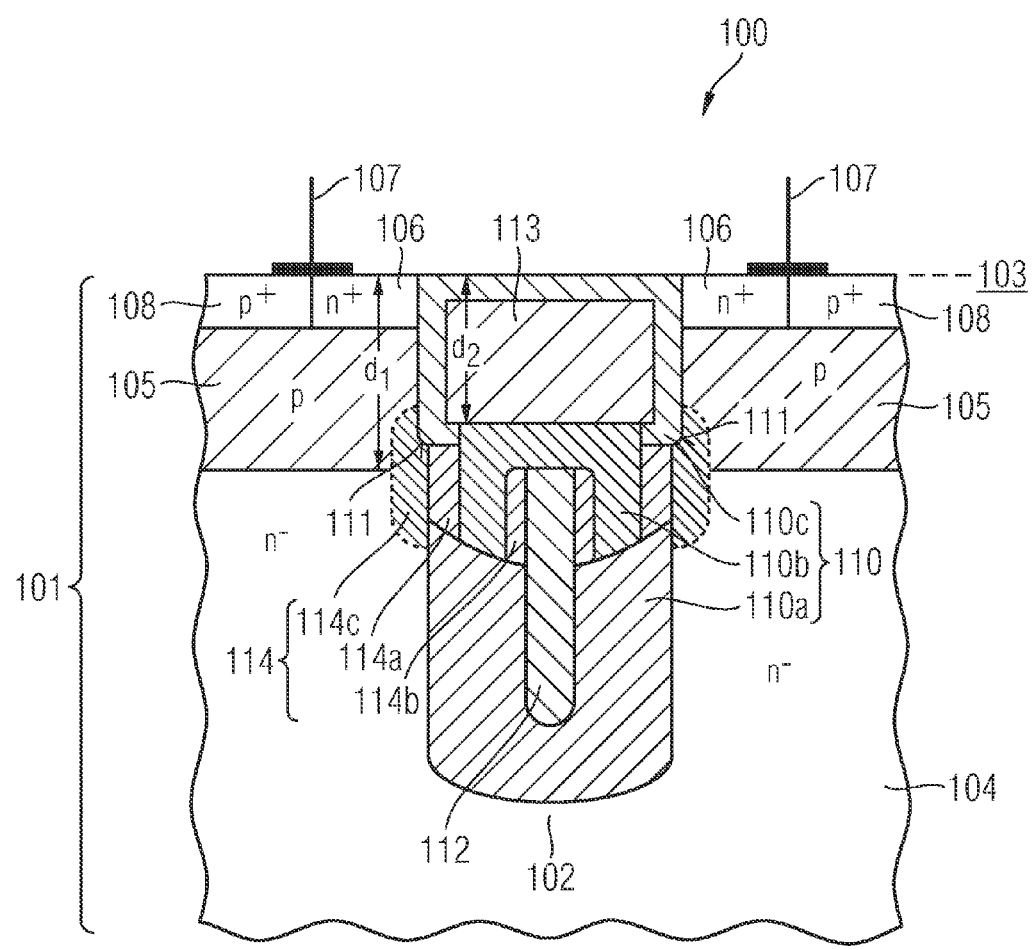
FIGS. 1 to 3 illustrate schematic cross-sections of semiconductor devices including auxiliary structures configured to improve the trade-off between the specific on-state resistance Ron and the gate to drain charge Qgd.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. Doping regions of the same relative doping concentration may or may not have the same absolute doping concentration. For example, two different $n^+$-doped regions can have different absolute doping concentrations. The same applies, for example, to an $n^-$-doped and a $p^+$-doped region. In the embodiments described below, a conductivity type of the illustrated semiconductor regions is denoted n-type or p-type, in more detail one of $n^-$ type, n-type, $n^+$-type, $p^-$type, p-type and $p^+$-type. In each of the illustrated embodiments, the conductivity type of the illustrated semiconductor regions may be vice versa. In other words, in an alternative embodiment to any one of the embodiments described below, an illustrated p-type region may be n-type and an illustrated n-type region may be p-type.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

FIG. 1 illustrates a cross-section of a part of a semiconductor device 100 according to an embodiment. The semiconductor device 100 includes a semiconductor body 101. A trench 102 extends into the semiconductor body 101 from a surface 103. An $n^-$-type drift zone 104 adjoins a lower part of the trench 102. A p-type body region 105 adjoins an upper part of the trench 102. An $n^+$-type source region 106 is arranged in the p-type body region 105 and adjoins the trench 102. The $n^+$-type source region 106 is electrically coupled to a contact 107 on the surface 103. The contact 107 is illustrated in a simplified manner and may include a conductive material in contact with the surface 107, e.g. a conductive plug or a conductive line including one or more of doped semiconductor material(s), silicide(s), metal(s). The p-type body region 105 is electrically coupled to the contact 107 via a $p^+$-type body contact zone 108.

In the semiconductor device 100, the source region 106 and the drift zone 104 are doped with a dopant of a first conductivity type in this embodiment, for example arsenic (As) for an n-type doping. However, phosphorus (P), sulphur (S) and/or antimony (Sb) can be used as the n-type dopant. By contrast, the body region 105 and the body contact zone 108 are doped with a dopant of a second conductivity type such as, for example boron (B), aluminum (Al) and/or indium (In) as p-type dopant. Depending on the dopant used for the individual regions, therefore, an n-channel or p-channel field effect transistor may be formed as the semiconductor device 100. In the semiconductor device 100, the n-type drift zone 104 may adjoin an $n^+$-type drain (not illustrated in FIG. 1) at a second surface opposite to the surface 103. The second surface may constitute a rear side of the semiconductor body 101 and the surface 103 may constitute a front side of the semiconductor body 101. According to another embodiment, the $n^+$-type drain (not illustrated in FIG. 1) may be arranged as an up-drain at the surface 103.

In the trench 102 a dielectric structure 110 is arranged. The dielectric structure 110 includes a first dielectric part 110a in a lower part of the trench 102, a second dielectric part 110b in a middle part of the trench 102 and a third dielectric part 110c in an upper part of the trench 102. Each one of the first to third dielectric parts 110a . . . 110c includes one or more electrically insulating materials such as oxide and/or nitride, for example. As an example, the third dielectric part 110c may include a thermal oxide. When forming the thermal oxide, semiconductor material of the semiconductor body 101 surrounding the upper part of the trench 102 is oxidized leading to a step 111 at a bottom side of the third part 110c.

A field electrode 112 is arranged in a lower part of the trench 102 and a gate electrode 113 is arranged in an upper part of the trench 102. Highly doped polysilicon is one example for a material used for the gate electrode 113 and/or field electrode 112, but any other conductive material such as, for example, metal silicide, metal or the like can also be used. A portion of the dielectric structure 110 that is interposed between the gate electrode 113 and the body region 105 constitutes a gate dielectric.

In the trench 102, an auxiliary structure 114 is arranged. The auxiliary structure 114 includes a first auxiliary part 114a, a second auxiliary part 114b and a third auxiliary part 114c. The first auxiliary part 114a may include a doped semiconductor material. Dopants of the first auxiliary part 114a that diffuse into a surrounding part of the semiconductor body 101 adjoining the first auxiliary part 114a constitute the third auxiliary part 114c. Diffusion of dopants from the first auxiliary part 114a into the surrounding semiconductor body 101 depends on a thermal budget of processing of the semiconductor body 101 during and after formation of the first auxiliary part 114a as well as on the type of dopant and level of doping within the first auxiliary part 114a, for example. As an example, the first and second auxiliary parts 114a, 114b may be formed by selective epitaxy. As a further example, the first and second auxiliary parts 114a, 114b may include a doped glass. As another example, the first and second auxiliary parts 114a, 114b may include recrystallized doped semiconductor material. A conductivity type of the third auxiliary part 114c is the same as the conductivity type of the drift zone 104. In the embodiment illustrated in FIG. 1, the conductivity type of the third auxiliary part 114c is n-type.

A borderline between the third auxiliary part 114c and the drift zone 104 may be that line where an n-doping of the third auxiliary part 114c exceeds the n-doping within the drift zone 104 by at least 30%. Formation of the auxiliary structure 114 allows a) minimizing a gate to drain charge Qgd by adjusting a first distance $d_1$ from the surface 103 to a location where an interface between the drift zone 104 and the body region 105 adjoins the third auxiliary part 114c larger than a second distance $d_2$ from the surface 103 to a bottom side of the gate electrode 113 at a location where the gate electrode 113 adjoins the third auxiliary part 114c, and b) reducing the specific on-resistance Ron by adjusting a channel end, i.e. a top side of the third auxiliary part 104c, at or above a bottom side of the gate dielectric. The distances $d_1$ and $d_2$ refer to a same top level and in case of a curved surface 103, $d_1$ and $d_2$ may refer to an uppermost level of the semiconductor body 101. A lateral dose of the third auxiliary part 114c may be set below a breakdown charge, e.g. several $10^{12}$ cm$^{-2}$.

The semiconductor device 100 may be a field effect transistor (FET) such as a metal oxide semiconductor FET (MOSFET), for example.

Figure 2:
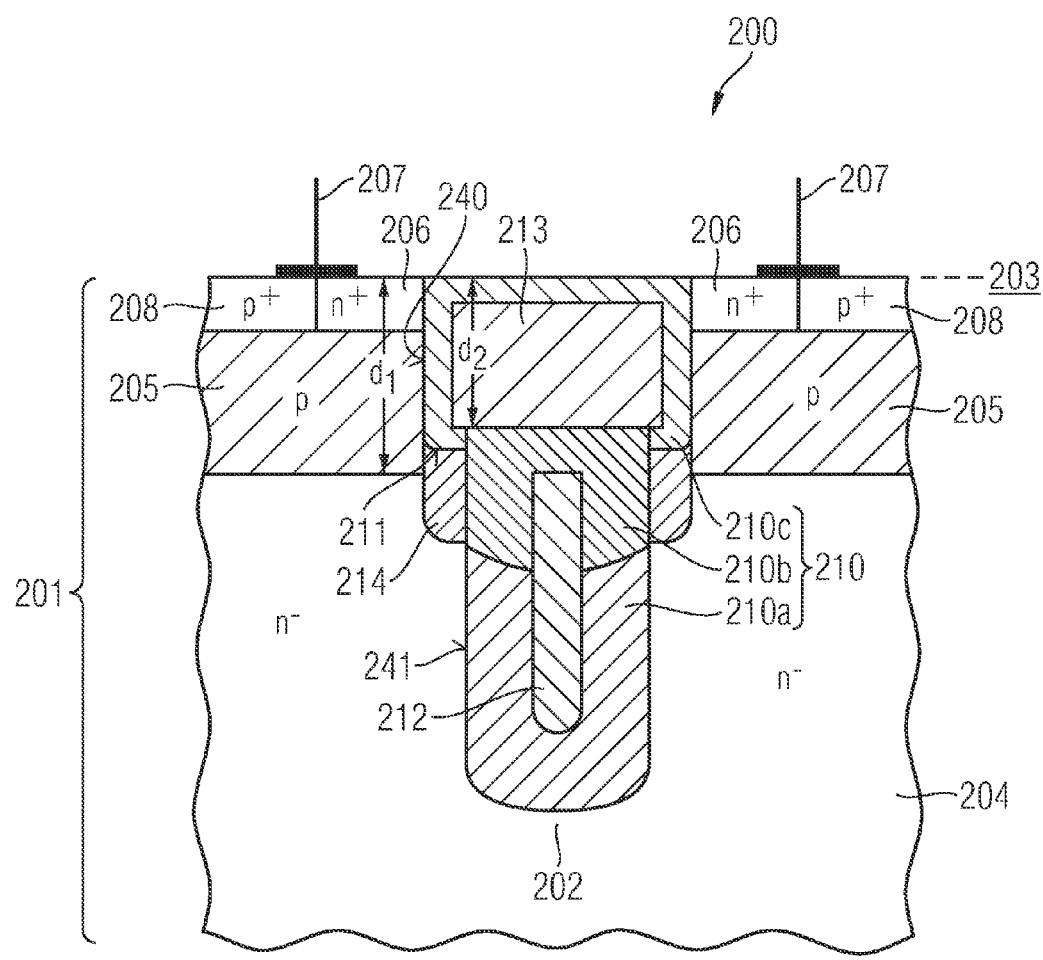

FIG. 2 illustrates a cross-section of a part of a semiconductor device 200 according to another embodiment. Similar to the semiconductor device 100 illustrated in FIG. 1, the semiconductor device 200 includes a semiconductor body 201, a trench 202 extending into the semiconductor body 201 from a surface 203, an n$^-$-type drift zone 204 adjoining a lower part of the trench 202, a p-type body region 205 adjoining an upper part of the trench 202, a p$^+$-type body contact zone 208 and an n$^+$-type source region 206 electrically coupled to a contact 207 on the surface 203, a dielectric structure 210 including a first dielectric part 210a in a lower part of the trench 202, a second dielectric part 210b in a middle part of the trench 202 and a third dielectric part 210c in an upper part of the trench 202, a field electrode 212 and a gate electrode 213.

The semiconductor device 200 further includes an auxiliary structure 214. The auxiliary structure 214 includes dopants of a conductivity type the same as the conductivity type of the drift zone 204. The dopants of the auxiliary structure 214 may be introduced into the auxiliary structure 214 by ion implantation, e.g. tilted ion implantation via sidewalls of the trench 202 before formation of the third dielectric part 210c and the second dielectric part 210b, for example. According to another embodiment, the dopants may be introduced into the auxiliary structure 214 via a dopant source, e.g. a doped glass or doped polysilicon arranged on the auxiliary structure 214, or via gas phase doping. A borderline between the auxiliary structure 214 and the drift zone 204 may be that line where an n-doping of the third auxiliary structure 214 exceeds the n-doping within the drift zone 204 by at least 30%.

The dielectric structure 210 includes a laterally staggered arrangement of an upper side face 240 and a lower side face 241 with a step 211 between the upper side face 240 and the lower side face 241. The third dielectric part 210c adjoins the upper side face 240 and the first and second dielectric parts 210a, 210b adjoin the lower side face 241. The auxiliary structure 214 adjoins only the lower side face 241 and the step 211 with respect to the dielectric structure 210.

Similar to the semiconductor device 100 illustrated in FIG. 1, formation of the auxiliary structure 214 allows a) minimizing a gate to drain charge Qgd by adjusting a first distance $d_1$ from the surface 203 to a location where an interface between the drift zone 204 and the body region 205 adjoins the auxiliary structure 214 larger than a second distance $d_2$ from the surface 203 to a bottom side of the gate electrode 213, and b) reducing the specific on-resistance Ron by adjusting a channel end, i.e. a top side of the auxiliary structure 214, at a bottom side of the gate dielectric.

Figure 3:
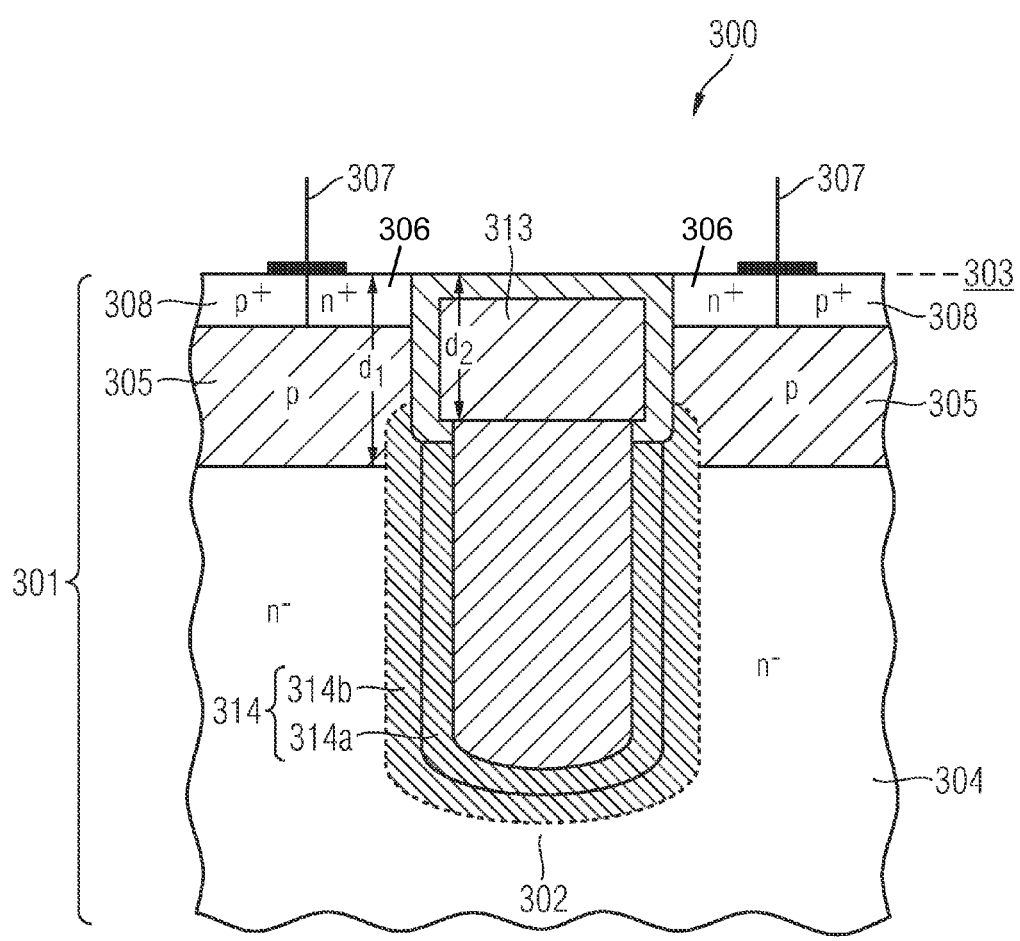

FIG. 3 illustrates a cross-section of a part of a semiconductor device 300 according to another embodiment. Similar to the semiconductor device illustrated in FIG. 1, the semiconductor device 300 includes a semiconductor body 301, a trench 302 extending into the semiconductor body 301 from a surface 303, an n$^-$-type drift zone 304 adjoining a lower part of the trench 302, a p-type body region 305 adjoining an upper part of the trench 302, a p$^+$-type body contact zone 308 and an n$^+$-type source region 306 electrically coupled to a contact 307 on the surface 303 as well as a gate electrode 313.

The semiconductor device 300 further includes an auxiliary structure 314 including a first auxiliary part 314a and a second auxiliary part 314b. The first auxiliary part 314a is a doped layer adjoining each one of a first side of the trench 302, a bottom side of the trench 302 and a second side of the trench 302 opposite to the first side. In other words, the first auxiliary part 314a lines a bottom part of the trench 302. Dopants of the first auxiliary part 314a that diffuse into a part of the semiconductor body 301 adjoining the first auxiliary part 314a constitute the second auxiliary part 314b. Diffusion of dopants from the first auxiliary part 314a into the surrounding semiconductor body 301 depends on a thermal budget of processing of the semiconductor body 301 during and after formation of the first auxiliary part 314a as well as on the type of dopant and level of doping within the first auxiliary part 314a, for example. As an example, the first auxiliary part 314a may be formed by selective epitaxy. As a further example, the first auxiliary part 314a may include a doped glass and/or a doped recrystallized semiconductor layer. A conductivity type of the second auxiliary part 314b is the same as the conductivity type of the drift zone 304. In the embodiment illustrated in FIG. 3, the conductivity type of the second auxiliary part 314b is n-type.

A borderline between the second auxiliary part 314b and the drift zone 304 may be that line where an n-doping of the second auxiliary part 314b exceeds the n-doping within the drift zone 304 by at least 30%. Formation of the auxiliary structure 314 allows a) minimizing a gate to drain charge Qgd by adjusting a first distance $d_1$ from the surface 303 to a location where an interface between the drift zone 304 and the body region 305 adjoins the second part 314b larger than a second distance $d_2$ from the surface 303 to a bottom side of the gate electrode 313, and b) reducing the specific on-resistance Ron by adjusting a channel end, i.e. a top side of the second auxiliary part 304b, at or above a bottom side of the gate dielectric.

Figure 4:
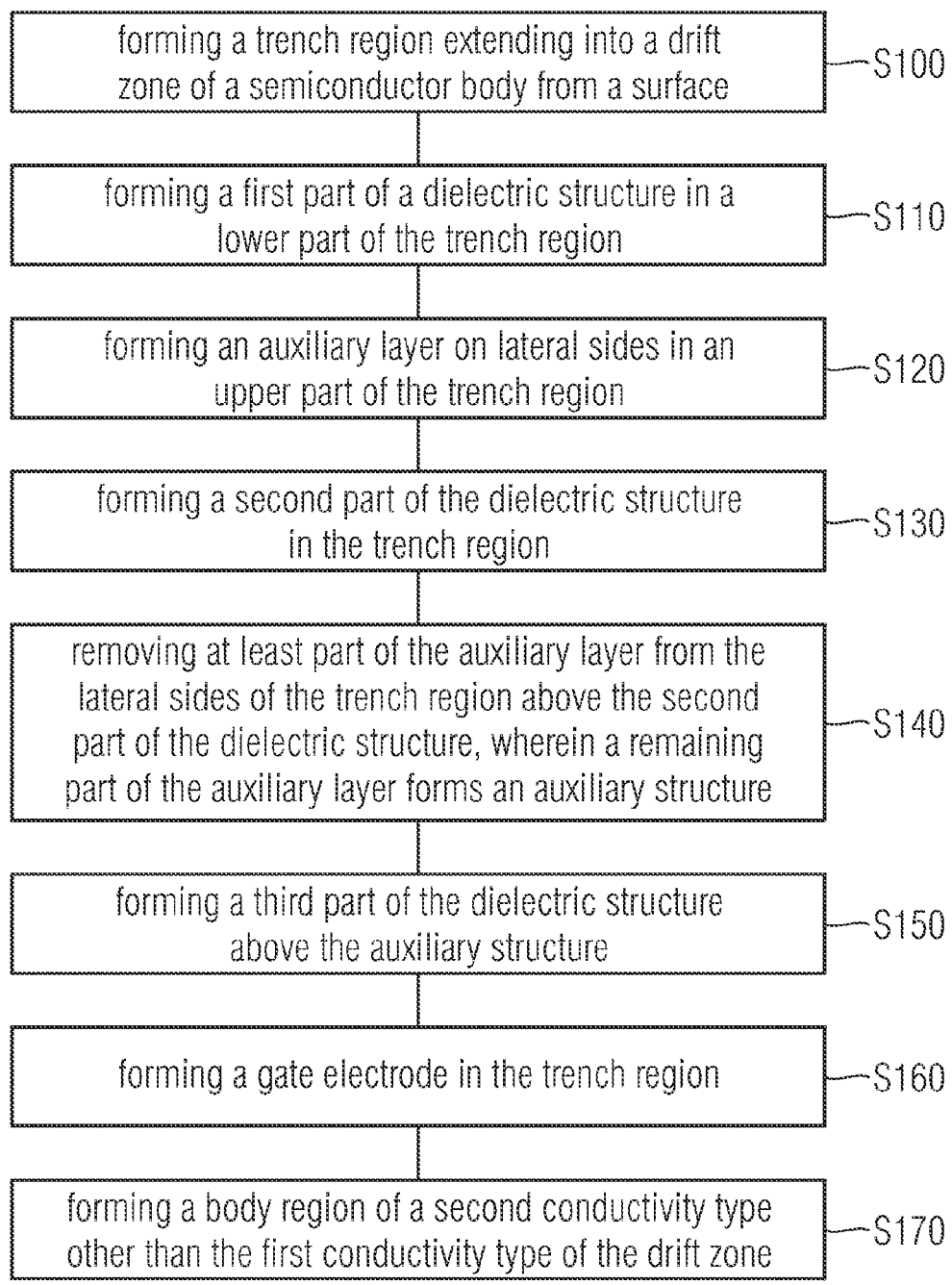
FIG. 4 illustrates a schematic process chart of one embodiment of a method for manufacturing a semiconductor device as illustrated in FIG. 1.

FIG. 4 illustrates a schematic process chart of a method of manufacturing a semiconductor device such as the device 100 illustrated in FIG. 1.

Process feature S100 includes forming a trench region extending into a drift zone of a semiconductor body from a surface.

Process feature S110 includes forming a first part of a dielectric structure in a lower part of the trench region.

Process feature S120 includes forming an auxiliary layer on lateral sides in an upper part of the trench region.

Process feature S130 includes forming a second part of the dielectric structure in the trench region.

Process feature S140 includes removing at least part of the auxiliary layer from the lateral sides of the trench region above the second part of the dielectric structure, wherein a remaining part of the auxiliary layer forms an auxiliary structure.

Process feature S150 includes forming a third part of the dielectric structure above the auxiliary structure.

Process feature S160 includes forming a gate electrode in the trench region.

Process feature S170 includes forming a body region of a second conductivity type other than the first conductivity type of the drift zone.

FIGS. 5A to 5I illustrate schematic cross-sections of a semiconductor body at different phases during manufacture of a semiconductor device such as illustrated in FIG. 1 according to an embodiment.

Figure 5A:
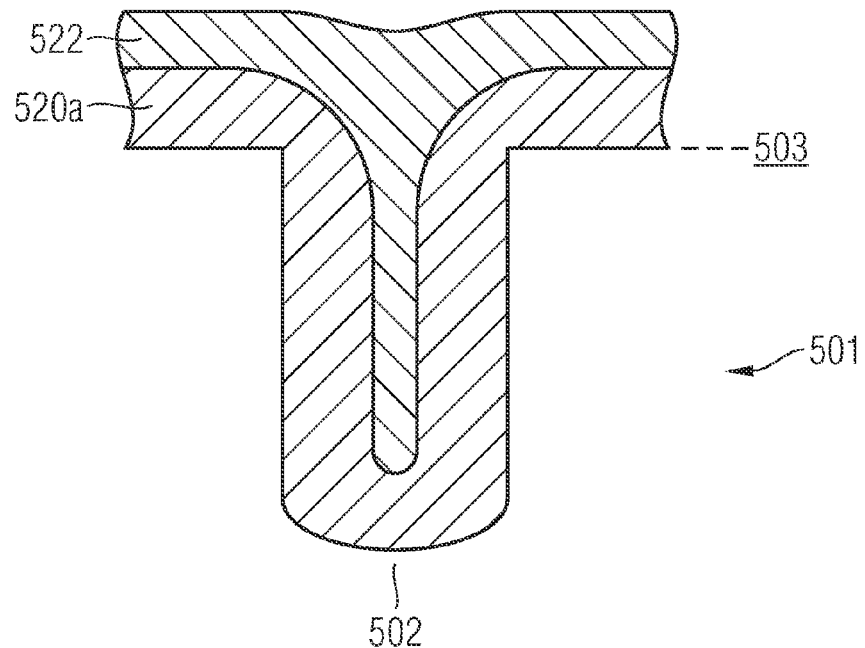
FIGS. 5A to 5I illustrate schematic cross-sections of a semiconductor body at different phases during one embodiment of a method for manufacturing a semiconductor device as illustrated in FIG. 1.

In the cross-section of a semiconductor body 501 illustrated in FIG. 5A, a trench 502 is formed into the semiconductor body 501 from a surface 503. As an example, the trench 502 may be formed by anisotropic etching, e.g. dry etching. The semiconductor body 501 may be a semiconductor wafer, e.g. a silicon wafer, including none, one or a plurality of semiconductor layers, e.g. epitaxial semiconductor layers, thereon.

A first dielectric layer 520a such as an oxide layer is formed on the surface 503, on sidewalls and on a bottom side of the trench 502. According to one embodiment, the first dielectric layer 520a is formed by deposition such as conformal deposition by a method such as low pressure chemical vapor deposition (LPCVD), for example. According to another embodiment, the first dielectric layer 520a is formed by thermal oxidation or a sequence of a thermal oxidation followed by a CVD process. Then, the trench 502 is filled up with a field electrode material 522, e.g. by deposition of a conductive material such as doped polysilicon, silicide, metal or a stack of any combination of these materials.

Figure 5B:
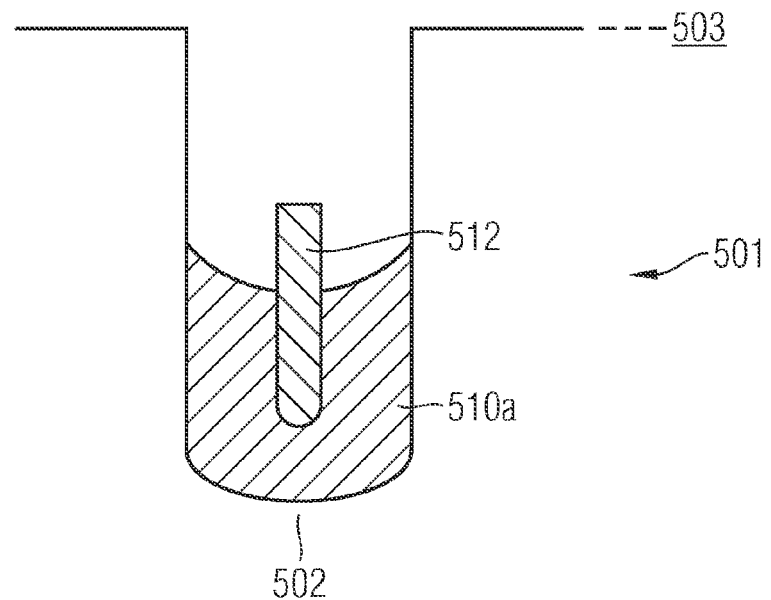

Referring to the cross-section of the semiconductor body 501 illustrated in FIG. 5B, the field electrode material 522 is removed in an upper part of the trench 502. A remaining material of the field electrode material constitutes a field electrode 512. The field electrode material 522 may be removed by selectively etching the field electrode material 522 over a material of the first dielectric layer 520a, for example. Then, the first dielectric layer 520a is removed in an upper part of the trench 502 and even below a top side of the field electrode 512. The first dielectric layer 520a may be removed by etching such as wet etching, for example. A remainder of the first dielectric layer 520a constitutes a first dielectric part 510a of a dielectric structure 510.

Figure 5C:
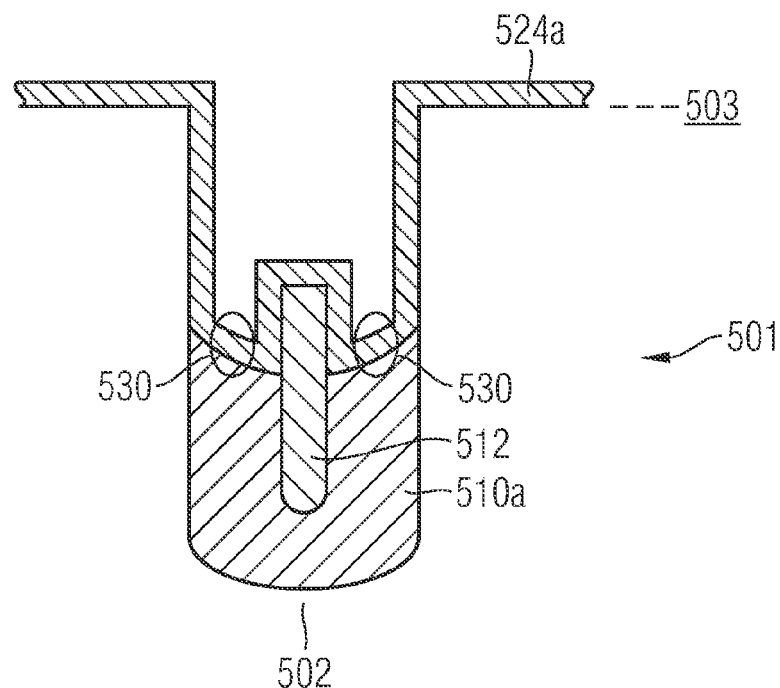

Referring to the cross-section of the semiconductor body 501 illustrated in FIG. 5C, a doped layer 524a such as a doped semiconductor layer or a doped glass layer is formed on the surface 503 and on an exposed surface in the trench 502. According to the embodiment illustrated in FIG. 5C, the doped layer 524a is deposited, e.g. in conformal manner, by an appropriate conformal deposition method such as LPCVD, for example. According to another embodiment, the doped layer 524a may be formed as a doped semiconductor layer 524a by selective epitaxial growth. In this case, the doped semiconductor 524a may be absent in a region 530 if selective growth parameters are chosen. A thickness of the doped semiconductor layer 524a may be in a range between 10 nm and 100 nm, for example. A concentration of dopants may be set in a range of $5\times10^{15}$ cm$^{-3}$ to $5\times10^{18}$ cm$^{-3}$, for example. The dopants may be introduced into the doped semiconductor layer 524a in-situ, i.e. during growth of the layer, or after growth of the layer by ion implantation or diffusion, for example.

Figure 5D:
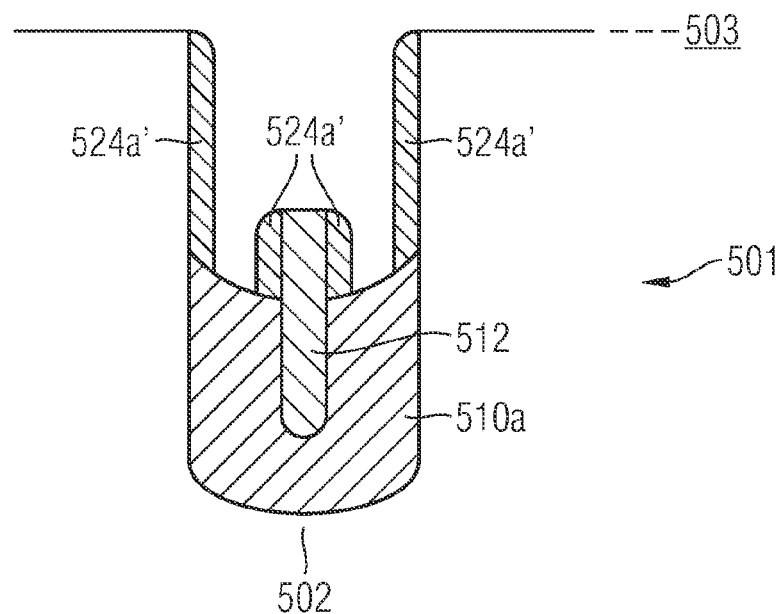

Referring to the cross-section of the semiconductor body 501 illustrated in FIG. 5D, the doped layer 524a is removed from the surface 503 and uppermost portions of the first dielectric part 510a and the field electrode 512 by an anisotropic etch such as a spacer etch process, for example. A remaining part of the doped layer 524a is denoted by reference symbol 524a'.

Referring to the cross-section of the semiconductor body 501 illustrated in FIG. 5D, a second dielectric part 510b of the dielectric structure 510 is formed in the trench 502. The second dielectric part 510b may be formed as a second dielectric layer, e.g. an oxide and/or nitride such as a high density plasma (HDP) oxide and/or tetraethyl orthosilicate (TEOS). Formation of the second dielectric part 510b may include dielectric layer formation, e.g. deposition, and partial removal of the second dielectric layer from the surface 503 and an upper part of the trench 502 by way of an appropriate method such as dry etching. A remaining part of the second dielectric layer in the trench 502 constitutes the second dielectric part 510b of the dielectric structure 510. A top side of the second dielectric part 510b is adjusted above the top side of the field electrode.

Referring to the cross-section of the semiconductor body 501 illustrated in FIG. 5F, the doped layer 524a' is removed in an upper part of the trench 502 up to a level of or, due to an undercut, slightly below the top side of the second dielectric part 510b. As an example, the doped layer 524a' may be removed by an isotropic etching process. A remaining part of the doped layer 524a' adjoining sidewalls of the trench 502 constitutes a first auxiliary part 514a. A remaining part of the doped layer 524a' adjoining the field electrode 512 constitutes a second auxiliary part 514b. A thermal budget affecting the semiconductor body 501 due to subsequent manufacturing steps such as thermal annealing and/or thermal oxidation causes dopants to diffuse from the first auxiliary part 514a into a surrounding part of the semiconductor body 501. The dopants diffused into the surrounding part semiconductor body 501 constitute a third part of the auxiliary structure (not illustrated in FIG. 5F to 5I, see FIG. 1). As an example, an extension of the third part of the auxiliary structure increases with an increase of the thermal budget configured to diffuse dopants from the first auxiliary part 514a into the surrounding semiconductor body 501.

Figure 5E:
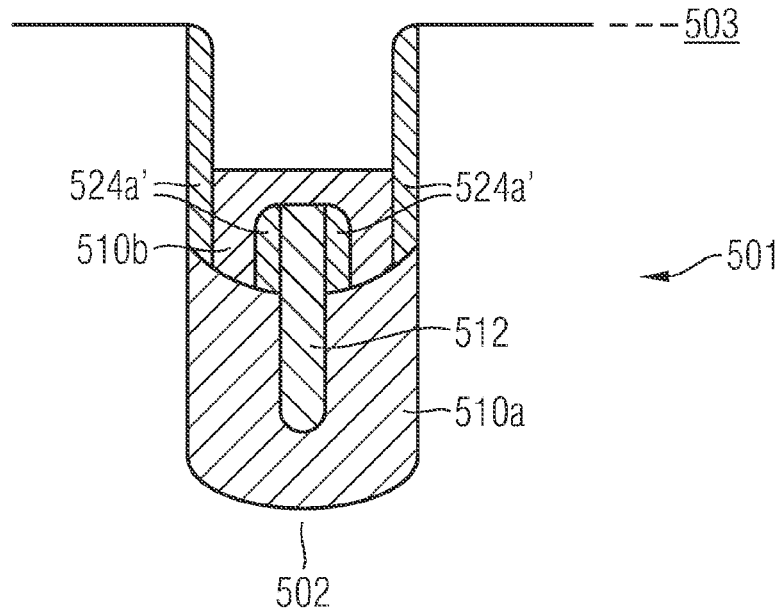
Figure 5F:
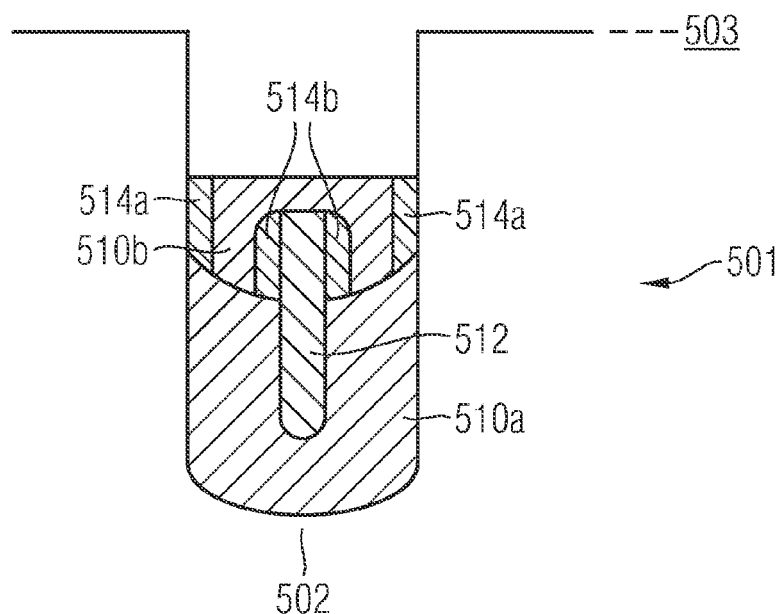
Figure 5G:
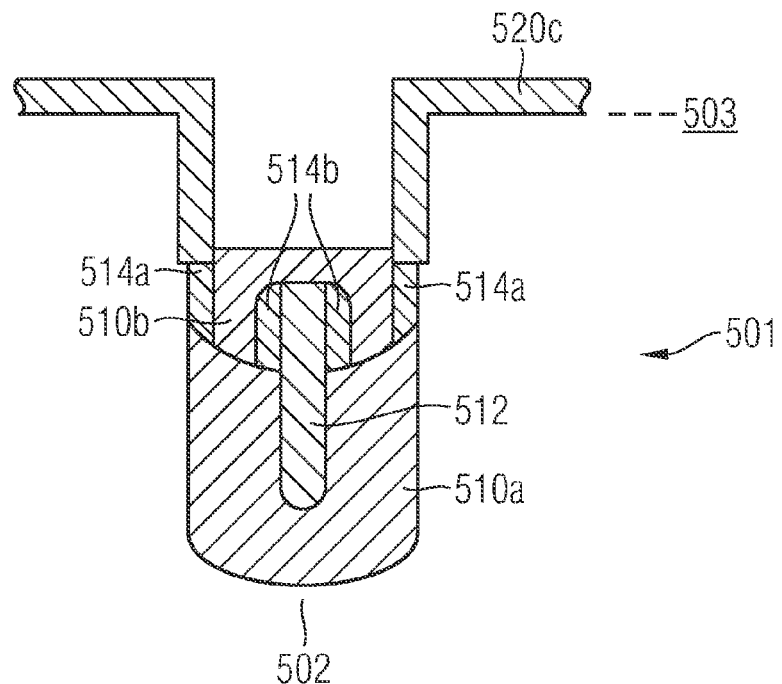

Referring to the cross-section of the semiconductor body 501 illustrated in FIG. 5G, a third dielectric layer 520c such as an oxide or nitride is formed on exposed sidewalls within the trench 502 and on the surface 503. In the schematic illustration of FIG. 5G the third dielectric layer 520c is formed by thermal oxidation leading to oxidation of a part of the semiconductor body 501 adjoining the sidewalls of the trench 502 and of a part of the semiconductor body 501 adjoining the surface 503. Also a portion at a top part of the first auxiliary structure 514a is converted to an oxide.

Figure 5H:
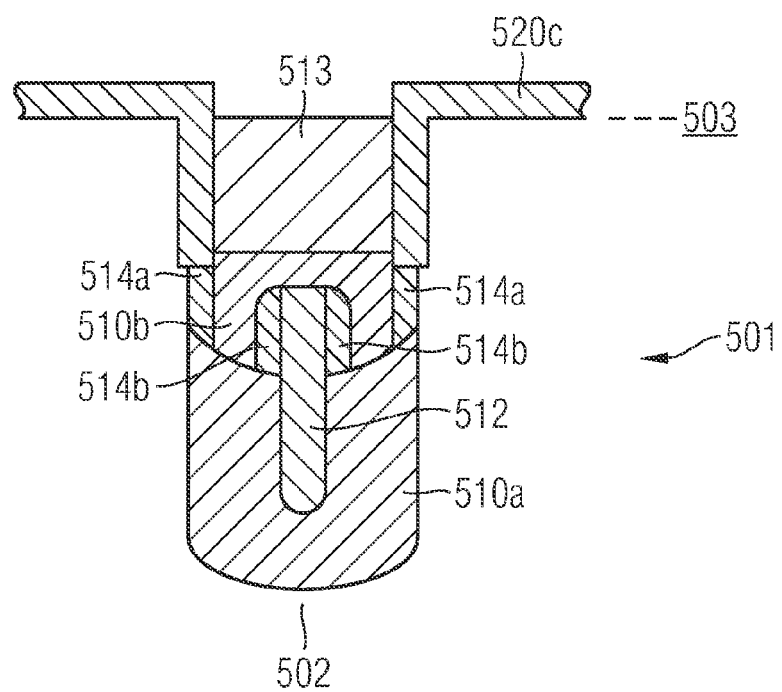

Referring to the cross-section of the semiconductor body 501 illustrated in FIG. 5H, the trench 502 is filled up with a gate electrode material, e.g. by deposition of a conductive material such as doped polysilicon, silicide, metal or a stack of any combination of these materials and a part of the gate electrode material is removed in an upper part of the trench 502. A remaining material of the gate electrode material constitutes a gate electrode 513. The gate electrode material may be removed by selectively etching the gate electrode material over materials of the second dielectric part 510b and the third dielectric layer 520c, for example.

Figure 5I:
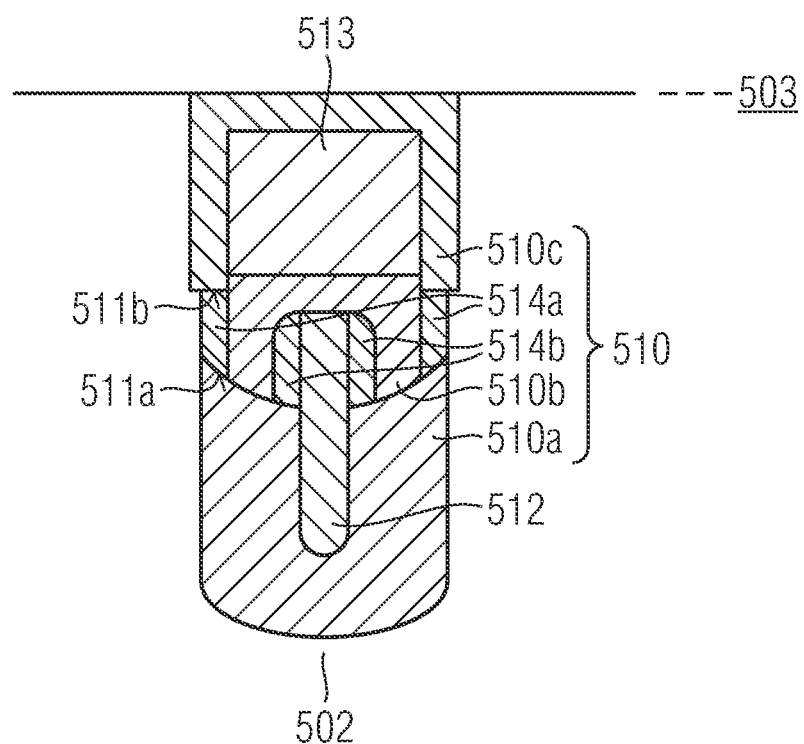

Referring to the cross-section of the semiconductor body 501 illustrated in FIG. 5I, an insulating cap, e.g. an oxide or nitride, is formed on the gate electrode 513 and the third dielectric layer 520c is removed from the surface 503, e.g. by etching or chemical mechanical polishing (CMP). A remaining part of the third dielectric layer 520c and the insulating cap constitute the third dielectric part 510c of the dielectric structure 510. The dielectric structure 510 includes a first step 511a and a second step 511b along a lateral side of the trench 502. The first auxiliary part 514a is arranged between the first step 511a and the second step 511b. According to another embodiment, third dielectric layer 520c may remain on the surface 503 and be patterned at a later stage to form contact openings therein.

Further to the process carried out in relation to the cross-section illustrated in FIG. 5I, other processes may be carried out, e.g. formation of semiconductor zones such as body, source, drain, contact zones, interconnection layer(s) and interlayer dielectric(s) resulting a device as illustrated in FIG. 1.

FIG. 6 illustrates a schematic process chart of a method of manufacturing a semiconductor device as illustrated in FIG. 2.

Process feature S200 includes forming a trench region extending into a drift zone of a semiconductor body from a surface.

Process feature S210 includes forming a first part of the dielectric structure in a lower part of the trench region.

Process feature S220 includes inserting dopants into the semiconductor body via lateral sides of the trench region above the first part of the dielectric structure.

Process feature S230 includes forming a second part of the dielectric structure in the trench region.

Process feature S240 removing a part of the semiconductor body at the lateral sides of the trench region above the second part of the dielectric structure, wherein a remaining part of the inserted dopants form an auxiliary structure.

Process feature S250 includes forming a third part of the dielectric structure above the second part of the dielectric structure.

Process feature S260 includes forming a gate electrode in the trench region.

Process feature S270 includes forming a body region of a second conductivity type other than the first conductivity type of the drift zone.

Figure 7:
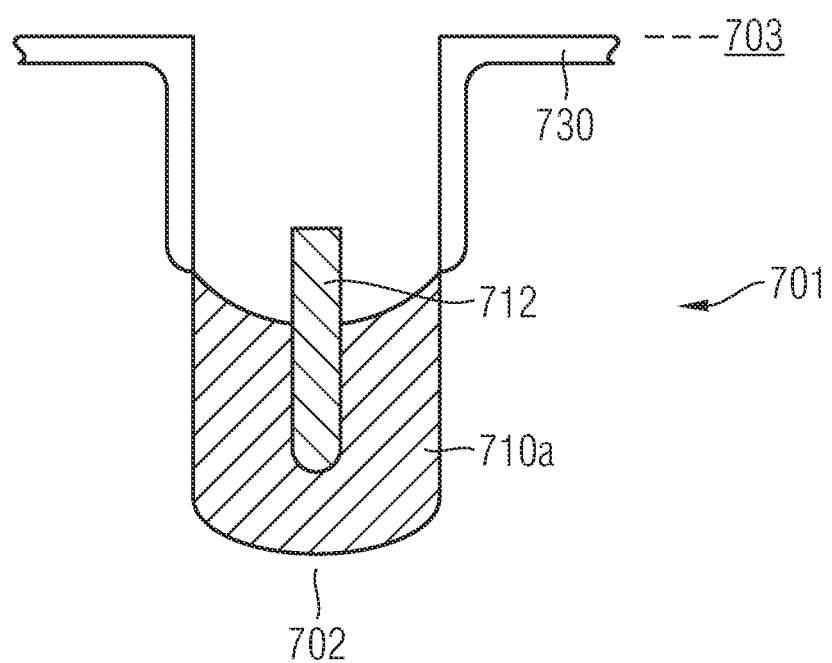
FIG. 7 illustrates a schematic cross-section of a semiconductor body at one phase during one embodiment of a method for manufacturing a semiconductor device as illustrated in FIG. 2.

FIG. 7 illustrates a schematic cross-section of a semiconductor body during manufacture of a semiconductor device according to another embodiment leading to a semiconductor device as illustrated in FIG. 2. Prior to the processes illustrated with reference to FIG. 7, processes as illustrated in FIGS. 5A and 5B are carried out.

Referring to the cross-section of a semiconductor body 701 illustrated in FIG. 7, dopants are introduced into the semiconductor body 701 via exposed sidewalls within a trench 702 and via a surface 703 leading to a doped layer 730. The dopants may be introduced by ion implantation or by outdiffusion from a deposited source or by gas phase doping, for example. A conductivity type of the dopants is the same as the conductivity type of a channel region of an FET to be formed. As an example, in case of an n-channel, n-type dopants such as phosphorus (P), sulphur (S) and/or antimony (Sb) can be used. In case of a p-type channel, p-type dopants such as boron (B), aluminum (Al) and/or indium (In) can be used.

Further processing of the semiconductor body 701 may continue as illustrated in FIG. 5E, i.e. formation of a second dielectric part may follow. Then, similar to FIG. 5F, the doped layer 730 is removed up to a top side of the second dielectric part. Further processes as illustrated and described in relation to FIGS. 5G to 5I follow and lead to device as illustrated in FIG. 2.

FIG. 8 illustrates a simplified process chart of a method of manufacturing a semiconductor device such as the device 300 illustrated in FIG. 3.

Process feature S300 includes forming a trench region extending into a drift zone of a semiconductor body from a surface.

Process feature S310 forming an auxiliary layer on each one of a first side of the trench region, a bottom side of the trench region and a second side of the trench region opposite to the first side.

Process feature S320 includes forming a first part of the dielectric structure in the trench region.

Process feature S330 removing the auxiliary layer from the first and second sides of the trench region above the first part of the dielectric structure, wherein a remaining part of the auxiliary layer forms an auxiliary structure.

Process feature S340 includes forming a second part of the dielectric structure above the auxiliary structure.

Process feature S350 includes forming a gate electrode in the trench region.

Process feature S360 includes forming a body region of a second conductivity type.

Processes carried out in S300 to S360 may include similar materials and/or manufacturing methods as illustrated and described in more detail with regard to FIGS. 5A to 5I and FIG. 7.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench region extending into a drift zone of a semiconductor body from a surface;
   a dielectric structure including a first step and a second step along a lateral side of the trench region;
   an auxiliary structure of a first conductivity type between the first step and the second step;

a gate electrode in the trench region;
a body region of a second conductivity type other than the first conductivity type of the drift zone; and wherein
the auxiliary structure adjoins each one of the drift zone, the body region and the dielectric structure.

2. The semiconductor device of claim 1, wherein the auxiliary structure includes at least one of a doped epitaxial layer, a doped recrystallized layer and a doped glass.

3. The semiconductor device of claim 1, wherein a lateral thickness of the auxiliary structure is in a range between 10 nm to 100 nm.

4. The semiconductor device of claim 1, wherein a maximum doping concentration is larger in the auxiliary structure than in the drift zone.

5. The semiconductor region of claim 1, wherein a first distance from the surface to a location where an interface between the drift zone and the body region adjoins the auxiliary structure is larger than a second distance from the surface to a bottom side of the gate electrode.

6. The semiconductor device of claim 1, further comprising a field electrode arranged between the gate electrode and a bottom side of the trench region.

7. The semiconductor device of claim 6, wherein the auxiliary structure includes a first part adjoining each one of the drift zone, the body region and the dielectric structure and a second part adjoining the field electrode.

8. A semiconductor device, comprising:
a trench region extending into a drift zone of a semiconductor body from a surface;
a dielectric structure including a laterally staggered arrangement of an upper side face and a lower side face with a step between the upper side face and the lower side face;
an auxiliary structure of a first conductivity type adjoining only the lower side face and the step with respect to the dielectric structure;
a gate electrode in the trench region;
a body region of a second conductivity type other than the first conductivity type of the drift zone; and wherein
the auxiliary structure further adjoins each one of the drift zone and the body region.

9. The semiconductor device of claim 8, wherein a lateral thickness of the auxiliary structure is in a range between 10 nm to 100 nm.

10. The semiconductor device of claim 8, wherein a maximum doping is higher in the auxiliary structure than in the drift zone.

11. The semiconductor region of claim 8, wherein a first distance from the surface to a location where an interface between the drift zone and the body region adjoins the auxiliary structure is larger than a second distance from the surface to a bottom side of the gate electrode.

12. A semiconductor device, comprising:
a trench region extending into a drift zone of a semiconductor body from a surface;
an auxiliary structure of a first conductivity type adjoining each one of a first side of the trench region, a bottom side of the trench region and a second side of the trench region opposite the first side;
a dielectric structure in the trench region;
a gate electrode in the trench region;
a body region of a second conductivity type other than the first conductivity type of the drift zone; wherein
the auxiliary structure adjoins each one of the drift zone, the body region and the dielectric structure; and
a first distance from the surface to a location where an interface between the drift zone and the body region adjoins the auxiliary structure is larger than a second distance from the surface to a bottom side of the gate electrode.

13. The semiconductor device of claim 12, wherein a lateral thickness of the auxiliary structure is in a range between 10 nm to 100 nm.

14. The semiconductor device of claim 12, wherein a maximum doping is larger in the auxiliary structure than in the drift zone.

15. A method for manufacturing a semiconductor device, comprising:
forming a trench region extending into a drift zone of a semiconductor body from a surface;
forming a first part of a dielectric structure in a lower part of the trench region;
forming an auxiliary layer on lateral sides in an upper part of the trench region;
forming a second part of the dielectric structure in the trench region;
removing at least part of the auxiliary layer from the lateral sides of the trench region above the second part of the dielectric structure, wherein a remaining part of the auxiliary layer forms an auxiliary structure;
forming a third part of the dielectric structure above the auxiliary structure;
forming a gate electrode in the trench region; and
forming a body region of a conductivity type other than the conductivity type of the drift zone.

16. The method of claim 15, wherein forming the third part of the dielectric structure includes forming a thermal oxide.

17. The method of claim 15, further comprising forming a field electrode in the trench region before forming the gate electrode.

18. The method of claim 15, wherein forming the auxiliary layer includes at least one of selective epitaxy, deposition of semiconductor material followed by recrystallization, and doped glass.

19. The method of claim 15, wherein forming the auxiliary layer includes at least one of in-situ doping and ion implantation of dopants.

20. A method for manufacturing a semiconductor device, comprising:
forming a trench region extending into a drift zone of a semiconductor body from a surface;
forming a first part of a dielectric structure in a lower part of the trench region;
inserting dopants into the semiconductor body via lateral sides of the trench region above the first part of the dielectric structure;
forming a second part of the dielectric structure in the trench region;
removing a part of the semiconductor body including inserted dopants at the lateral sides of the trench region above the second part of the dielectric structure, wherein a remaining part of the inserted dopants form an auxiliary structure;
forming a third part of the dielectric structure above the second part of the dielectric structure;
forming a gate electrode in the trench region; and
forming a body region of a conductivity type other than the conductivity type of the drift zone.

21. The method of claim 20, wherein forming the third part of the dielectric structure includes forming a thermal oxide.

22. The method of claim 20, wherein inserting dopants into the semiconductor body includes at least one of tilted implantation, forming a diffusion source at lateral sides of the trench region followed by inserting the dopants from the diffusion source into the semiconductor body and inserting the dopants from a gas including dopant species.

23. The method of claim 22, wherein the diffusion source includes at least one of doped glass and doped amorphous or polycrystalline silicon.

24. A method for manufacturing a semiconductor device, comprising:
- forming a trench region extending into a drift zone of a semiconductor body from a surface;
- forming an auxiliary layer on each one of a first side of the trench region, a bottom side of the trench region and a second side of the trench region opposite the first side;
- forming a first part of a dielectric structure in the trench region;
- removing the auxiliary layer from the first and second sides of the trench region above the first part of the dielectric structure, wherein a remaining part of the auxiliary layer forms an auxiliary structure;
- forming a second part of the dielectric structure above the auxiliary structure;
- forming a gate electrode in the trench region; and
- forming a body region.

25. The method of claim 24, wherein:
- the auxiliary structure adjoins each one of the drift zone, the body region and the dielectric structure; and
- a first distance from the surface to a location where an interface between the drift zone and the body region adjoins the auxiliary structure is larger than a second distance from the surface to a bottom side of the gate electrode.

* * * * *